(12) United States Patent
Huang et al.

(10) Patent No.: US 11,264,107 B2
(45) Date of Patent: Mar. 1, 2022

(54) DATA READING CIRCUIT OF EMBEDDED FLASH MEMORY CELL

(71) Applicant: SHANGHAI HUAHONG GRACE SEMICONDUCTOR MANUFACTURING CORPORATION, Shanghai (CN)

(72) Inventors: Mingyong Huang, Shanghai (CN); Jun Xiao, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 17/021,550

(22) Filed: Sep. 15, 2020

(65) Prior Publication Data

US 2021/0304823 A1 Sep. 30, 2021

(30) Foreign Application Priority Data

Mar. 24, 2020 (CN) .......................... 202010210569.6

(51) Int. Cl.
| | |
|---|---|
| *G11C 7/00* | (2006.01) |
| *G11C 16/26* | (2006.01) |
| *G11C 16/24* | (2006.01) |
| *G11C 16/30* | (2006.01) |
| *G11C 16/04* | (2006.01) |

(52) U.S. Cl.
CPC .............. *G11C 16/26* (2013.01); *G11C 16/24* (2013.01); *G11C 16/30* (2013.01); *G11C 16/0408* (2013.01)

(58) Field of Classification Search
CPC ....... G11C 7/1051; G11C 7/22; G11C 7/1072; G11C 7/1006; G11C 7/1066
USPC .................. 365/189.15, 189.14, 203, 189.06
See application file for complete search history.

(56) References Cited

U.S. PATENT DOCUMENTS

| | | | | |
|---|---|---|---|---|
| 5,498,990 | A * | 3/1996 | Leung ................. | G06F 13/4077 327/323 |
| 7,535,783 | B2 * | 5/2009 | DeBrosse .............. | G11C 7/062 365/207 |
| 9,224,464 | B2 * | 12/2015 | Chou ........................ | G11C 7/12 |
| 9,641,193 | B2 * | 5/2017 | Baker ...................... | G11C 7/16 |

* cited by examiner

*Primary Examiner* — Son T Dinh
(74) *Attorney, Agent, or Firm* — MKG, LLC

(57) ABSTRACT

The application relates to a data reading circuit of an embedded flash memory cell. The data reading circuit a switch circuit, a current clamp circuit, a current mirror circuit, a reference current source, a precharge circuit and a comparison circuit; the switch circuit includes a transmission gate, one end of the transmission gate is connected with a drain of the embedded flash memory cell, and the other end of the transmission gate is connected with a detection end of the current clamp circuit; a response end of the current clamp circuit is connected with a data node; the current mirror circuit is connected with the reference current source and the data node; an output end of the precharge circuit is connected with the data node; one input end of the comparison circuit is connected with the data node, and the other input end is connected with reference voltage.

6 Claims, 3 Drawing Sheets

DATA READING CIRCUIT OF EMBEDDED FLASH MEMORY CELL

CROSS-REFERENCE TO RELATED APPLICATION

This application claims priority to Chinese patent application no. CN 202010210569.6, filed at CNIPA on Mar. 24, 2020, and entitled "DATA READING CIRCUIT OF EMBEDDED FLASH MEMORY CELL", the disclosure of which is incorporated herein by reference in entirety.

TECHNICAL FIELD

The application relates to the technical field of memories, and in particular to a data reading circuit of an embedded flash memory cell.

BACKGROUND

Embedded flash memory cell (eflash), due to its low cost, low power consumption, fast access speed and other performance advantages, has occupied an increasingly important position in the field of nonvolatile memories. With the development of science and technology, the application of data storage media has changed from some traditional nonvolatile memories to flash memories. Large-capacity solid-state memory devices, with flash memories as main storage media, have become one of the mainstream solutions to data storage up to now.

Generally, a flash memory cell includes a floating gate structure. By applying different operating voltage to a control gate, an intermediate electrode and a source in the flash memory cell, the reading operation, writing operation and erasing operation of the flash memory cell are realized. Content stored in the flash memory cell depends on a state of the floating gate structure that stores electrons. If the floating gate structure has no electrons, the data in the flash memory cell is 1; if the floating gate has electrons, the data in the flash memory cell is 0.

When the data in the flash memory cell is read, first reading voltage is applied to the middle electrode of the flash memory cell through a word line (WL), and second reading voltage is applied to a drain through a bit line BL. When the flash memory stores data as 1 (i.e., the floating gate is in the state without electrons), large current will be generated between the source and the drain of the flash memory cell due to the movement of a large amount of electrons. When the flash memory stores data as 0 (i.e., the floating gate is in the state that electrons are stored), the electrons in the floating gate structure absorb the voltage applied to the intermediate electrode, so that the electrons conducted in drain-source channel are reduced, resulting in small current. By determining the magnitude of the current flowing through the flash memory cell, the data stored in the flash memory cell can be determined.

In the related arts, a reading circuit for reading the data in the flash memory cell includes a switch module, a reference current source module, and a voltage comparison module. One end of the switch module is connected with the flash memory cell, the other end is connected with the reference current source module to form a data node, and one input end of the voltage comparison module is connected with the data node. During the operation of reading the data, the switch module is in an on state, a reference current source provided by the reference current source module is compared with the current in the flash memory cell, the data node is charged or discharged according to a comparison result to increase or decrease the voltage of the data node, and the voltage comparison module determines the voltage of the data node and outputs a determination result.

However, for an eflash in a 55 nm process, its core device voltage is 1.2V+/−10%, and threshold voltage is 0.6V for high-threshold N channels under the worst situation. When the traditional reading circuit works for a reading operation, it is necessary to apply switch control voltage (VDD) to the switch module to make the switch module on, so as to transmit 0.6V voltage to the bit line BL. When the switch control voltage is less than 1.2V, and for example, the switch control voltage is 1.05V, the switch module cannot be on, that is, the switch module cannot transmit 0.6V voltage to the bit line BL, such that the reading circuit fails.

BRIEF SUMMARY

The application provides a data reading circuit of an embedded flash memory cell, which can solve the problem that a switch circuit cannot be normally connected since switch control voltage is too small in the related arts.

The application provides a data reading circuit of an embedded flash memory cell, which includes:

a switch circuit, the switch circuit including a transmission gate, one transmission end of the transmission gate being connected with a drain of the embedded flash memory cell through a bit line, the other end of the transmission gate being connected with a detection end of a current clamp circuit, and the transmission gate being on when a first control end receives first switch control voltage and/or a second control end receives second switch control voltage;

the current clamp circuit, a response end of the current clamp circuit being connected with a data node;

a current mirror circuit, the current mirror circuit being connected with a reference current source and the data node, and configured to mirror-output the reference current source;

a precharge circuit, an output end of the precharge circuit being connected with the data node, and the precharge circuit being configured to charge the data node to precharge voltage when a precharge signal is received; and a comparison circuit, one input end of the comparison circuit being connected with the data node, the other input end being connected with reference voltage, the comparison circuit being configured to compare the reference voltage and the voltage of the data node when a second enable signal is received, and output data stored in the embedded flash memory cell according to a comparison result.

Alternatively, the first switch control voltage is at a high level and the second switch control voltage is at a low level.

Alternatively, the data reading circuit of the embedded flash memory cell further includes a second switch control voltage generation module and the second switch control voltage generation module is configured to output the second switch control voltage;

the second switch control voltage generation module includes a fourth resistor, one end of the fourth resistor is connected with the first switch control voltage, the other end of the fourth resistor is connected with one end of a fifth resistor, the other end of the fifth resistor is connected with one end of a sixth resistor, the other end of the sixth resistor is connected with one end of a seventh resistor, the other end of the seventh resistor is connected with one end of a first capacitor, and the first capacitor is grounded;

a connecting node between the sixth resistor and the seventh resistor is connected with one input end of a second comparator, the other input end of the second comparator is connected with a ground end, an output end of the second comparator is connected with an input end of a second inverter, an output end of the second inverter is connected with an enable end of a negative charge pump, an output end of the negative charge pump is connected with the other end of the seventh resistor, and a connecting node between the seventh resistor and the first capacitor is an output node of the second switch control voltage generation module.

Alternatively, the transmission gate includes a first NMOS transistor and a first PMOS transistor, a source of the first NMOS transistor is connected with a source of the first PMOS transistor to form one transmission end of the transmission gate, a drain of the first NMOS transistor is connected with a drain of the first PMOS transistor to form the other transmission end of the transmission gate, a gate of the first NMOS transistor is the first control end of the transmission gate, and a gate of the first PMOS transistor is the second control end of the transmission gate.

Alternatively, an equivalent bit line capacitor is connected between the data node and a ground wire.

Alternatively, the current clamp circuit includes a second NMOS transistor and a first inverter, an input end of the first inverter and a source of the second NMOS transistor form a detection end of the current clamp circuit, an output end of the first inverter is connected with a gate of the second NMOS transistor, and a drain of the second NMOS transistor is the response end of the current clamp circuit.

Alternatively, the current mirror circuit includes a second PMOS transistor and a third PMOS transistor, a gate of the second PMOS transistor is connected with a gate of the third PMOS transistor, a source of the second PMOS transistor and a source of the third PMOS transistor are connected with power supply voltage, a drain of the second PMOS transistor is short-circuited with the gate of the second PMOS transistor, the drain of the second PMOS transistor is connected with one end of the reference current source, a drain of the third PMOS transistor is an output end of the current mirror circuit, and the output end of the current mirror circuit is connected with the data node.

Alternatively, the precharge circuit includes a fourth PMOS transistor, a source of the fourth PMOS transistor is connected with precharge voltage, a gate of the fourth PMOS transistor is configured to receive the precharge signal, and a drain of the fourth PMOS transistor is the output end of the precharge circuit.

Alternatively, the comparison circuit includes a first comparator, a first buffer and a second buffer, an inverted-phase input end of the first comparator is connected with the data node, a normal-phase input end of the first comparator is connected with the reference voltage, an output end of the first comparator is sequentially connected with the first buffer and the second buffer, and an output end of the second buffer is an output end of the reading circuit.

The technical solution of the application at least has the following advantages: when the data reading circuit works, by inputting the first switch control voltage and/or the second switch control voltage to the corresponding control end, the data node and the bit line can be normally connected through the switch circuit after the preparation stage, the problem that the switch circuit cannot be normally connected since the switch control voltage is too small is avoided, the reliability of the data read by the reading circuit is guaranteed, and it is more applicable to the eflash in the 55 nm process.

BRIEF DESCRIPTION OF THE DRAWINGS

In order to more clearly describe the specific embodiments of the application or the technical solution in the prior art, the drawings which need be used in the description of the specific embodiments or the prior art will be briefly introduced below. Apparently, the drawings described below are some embodiments of the application. Those skilled in the art may obtain other drawings according to these drawings without contributing any inventive labor.

DETAILED DESCRIPTION OF THE APPLICATION

Figure 1:
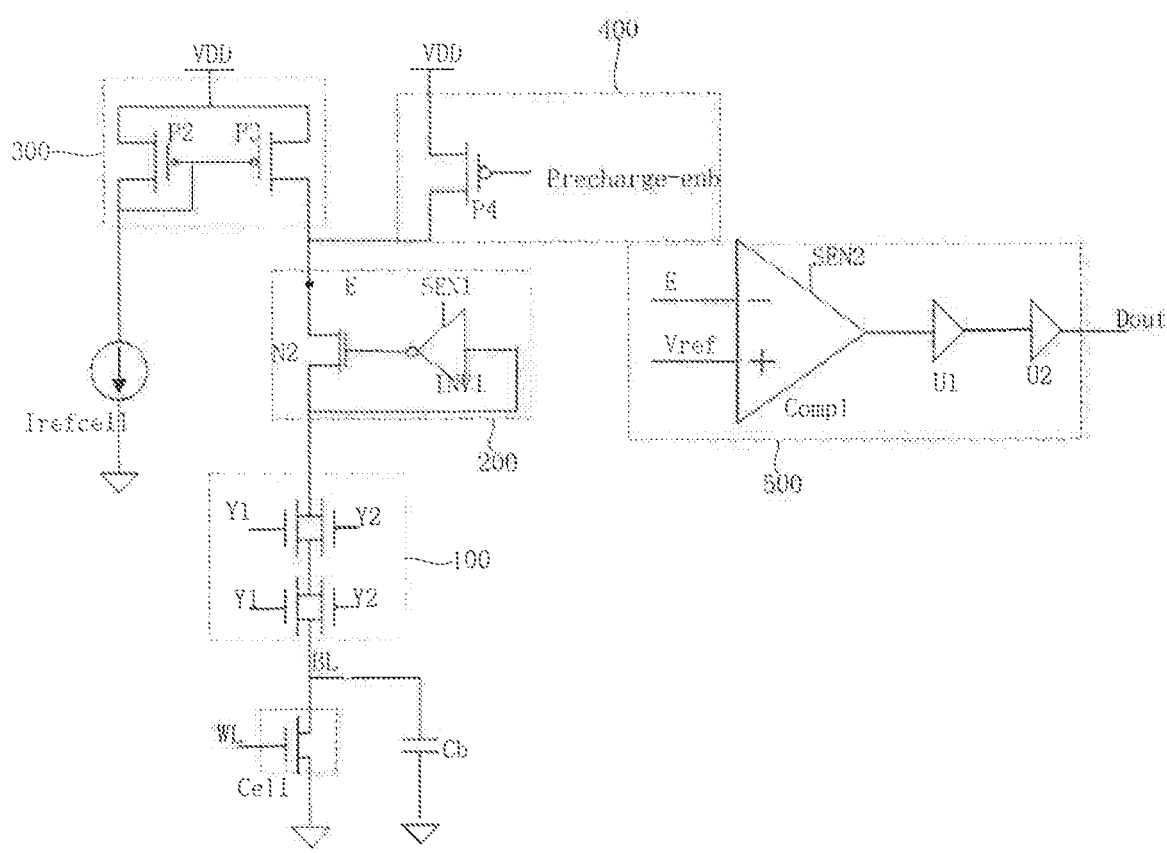
FIG. 1 illustrates a circuit diagram of a data reading circuit of an embedded flash memory cell according to an embodiment of the application.

The technical solution of the application will be described below clearly and completely with reference to the drawings. Apparently, the described embodiments are partial embodiments of the application, instead of all embodiments. Based on the embodiments of the application, all other embodiments obtained by those skilled in the art without contributing any inventive labor shall fall into the scope of protection of the application.

In the description of the application, it should be noted that the orientation or position relationships indicated by the terms such as "center", "top", "bottom", "left", "right", "vertical", "horizontal", "inside" and "outside" are based on the orientation or position relationships illustrated in the drawings, for the purpose of conveniently describing the application and simplifying the description, rather than indicating or implying that the device or component referred to must have a specific orientation and be constructed and operated in a specific orientation, and cannot be understood as limitations to the application. In addition, the terms "first", "second" and "third" are used only for the purpose of description, and shall not be understood as indicating or implying relative importance.

In the description of the application, it should be noted that, unless otherwise specified and limited, the terms "mounting", "interconnection" and "connection" shall be understood in a broad sense. For example, it may be fixed connection, detachable connection, or integrated connection; it may be mechanical connection or electrical connection; it may be direct connection or indirect connection through an intermediate medium; it may also be internal connection of two components, wireless connection or wired connection. Those skilled in the art may understand the specific meaning of the above terms in the application according to the specific circumstances.

In addition, the technical features described below in different embodiments of the application can be combined with each other as long as they do not constitute a conflict.

Figure 2:
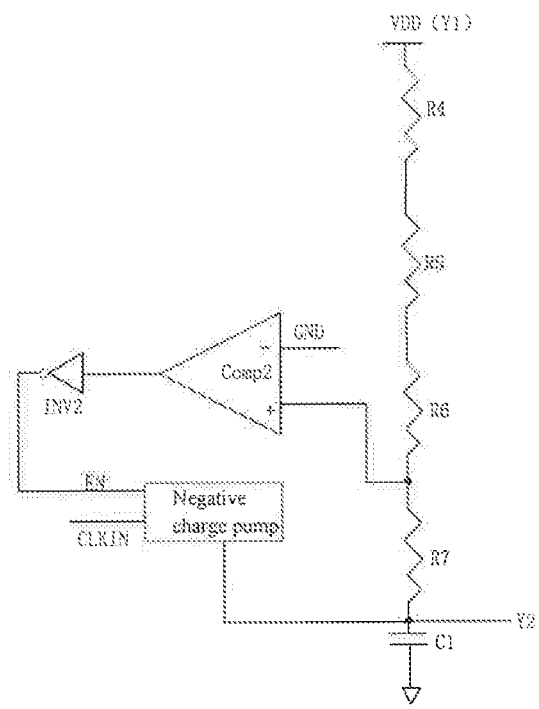
FIG. 2 illustrates a circuit diagram of a second switch control voltage generation module according to some embodiments.

Referring to FIG. 1, it illustrates a circuit diagram of a data reading circuit of an embedded flash memory cell according to some embodiments. Referring to FIG. 2, it illustrates a circuit diagram of a second switch control voltage generation module according to some embodiments.

Figure 4:
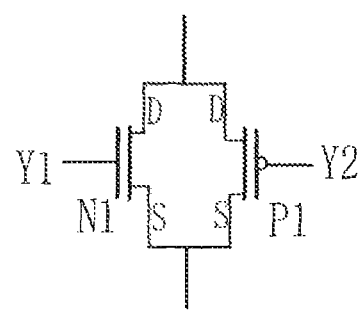
FIG. 4 illustrates a schematic diagram of a transmission gate in an on state according to some embodiments.

Referring to FIG. 4, it illustrates a schematic diagram of a transmission gate in an on state according to some embodiments.

Referring to FIG. 1, the data reading circuit is configured to read data stored in the embedded flash memory cell (Cell). The data stored in the embedded flash memory cell Cell is 1 or 0. An intermediate electrode of the embedded flash memory cell (Cell) is connected to a word line (WL), a drain of the embedded flash memory cell (Cell) is connected to a bit line (BL), and a source of the embedded flash memory cell (Cell) is grounded. The data reading circuit includes a switch circuit 100, a current clamp circuit 200, a current mirror circuit 300, a precharge circuit 400, and a comparison circuit 500.

The switch circuit 100 includes a transmission gate. Referring to FIG. 2 and FIG. 4, one transmission end of the transmission gate is connected with a drain of the embedded flash memory cell through the BL, and the other end of the transmission gate is connected with a detection end of the current clamp circuit 200; the transmission gate is on when a first control end receives first switch control voltage Y1 and/or a second control end receives second switch control voltage Y2. A second switch control voltage Y2 generation module is configured to output the second switch control voltage Y2. Alternatively, the first switch control voltage Y1 is at a high level, and the second switch control voltage Y2 is at a low level. Alternatively, the second switch control voltage Y2 is negative one-third of the first switch control voltage Y1.

Alternatively, the second switch control voltage Y2 generation module includes a fourth resistor R4, one end of the fourth resistor R4 is connected with the first switch control voltage Y1, the other end of the fourth resistor R4 is connected with one end of a fifth resistor R5, the other end of the fifth resistor R5 is connected with one end of a sixth resistor R6, the other end of the sixth resistor R6 is connected with one end of a seventh resistor R7, the other end of the seventh resistor R7 is connected with one end of a first capacitor C1, and the first capacitor C1 is grounded; a connecting node between the sixth resistor R6 and the seventh resistor R7 is connected with one input end of a second comparator COMP2, the other input end of the second comparator COMP2 is connected with a ground end GND, an output end of the second comparator COMP2 is connected with an input end of a second inverter INV2, an output end of the second inverter INV2 is connected with an enable end of a negative charge pump, an output end of the negative charge pump is connected with the other end of the seventh resistor R7, and a connecting node between the seventh resistor R7 and the first capacitor C1 is an output node of the second switch control voltage Y2 generation module.

Taking that the transmission gate includes a first NMOS transistor N1 and a first PMOS transistor P1 as an example, a source of the first NMOS transistor N1 is connected with a source of the first PMOS transistor P1 to form one transmission end of the transmission gate, a drain of the first NMOS transistor N1 is connected with a drain of the first PMOS transistor P1 to form the other transmission end of the transmission gate, a gate of the first NMOS transistor N1 is the first control end of the transmission gate, and a gate of the first PMOS transistor P1 is the second control end of the transmission gate. When the first switch control voltage Y1 is at a high level and is VDD according to one embodiment, the first NMOS transistor N1 is on; when the second switch control voltage Y2 is at a low level and is −⅓VDD according to one embodiment, the first PMOS transistor P1 is on.

Thus, when the first switch control voltage Y1 is low, the first NMOS transistor N1 cannot be on at the preparation stage, and the first PMOS transistor P1 can still be on through the second switch control voltage Y2 applied to the first PMOS transistor P1, such that a data node E and the bit line BL can be normally connected through the switch circuit 100 after the preparation stage. The high level is voltage which is applied to the gate of a corresponding MOS transistor, is greater than the threshold voltage of the MOS transistor and makes the MOS transistor on; the low level is voltage which is applied to the gate of a corresponding MOS transistor, is less than the threshold voltage of the MOS transistor and makes the MOS transistor off.

A response end of the current clamp circuit 200 is connected with the data node E. Alternatively, the current clamp circuit 200 includes a second NMOS transistor N2 and a first inverter INV1, an input end of the first inverter INV1 and a source of the second NMOS transistor N2 form a detection end of the current clamp circuit 200, an output end of the first inverter INV1 is connected with a gate of the second NMOS transistor N2, an enable end of the second inverter is configured to receive a first enable signal SEN1, and a drain of the second NMOS transistor N2 is the response end of the current clamp circuit 200.

The current mirror circuit 300 is connected with a reference current source Irefcell and the data node E, and configured to mirror-output the reference current source Irefcell. Alternatively, the current mirror circuit 300 includes a second PMOS transistor P2 and a third PMOS transistor P3, a gate of the second PMOS transistor P2 is connected with a gate of the third PMOS transistor P3, a source of the second PMOS transistor P2 and a source of the third PMOS transistor P3 are connected with power supply voltage VDD, a drain of the second PMOS transistor P2 is short-circuited with the gate of the second PMOS transistor P2, the drain of the second PMOS transistor P2 is connected with one end of the reference current source Irefcell, the other end of the reference current source Irefcell is grounded, a drain of the third PMOS transistor P3 is an output end of the current mirror circuit 300, and the output end of the current mirror circuit 300 is connected with the data node E. Mirror current that can be mirror-output by the current mirror circuit 300 is 30% of current generated by the reference current source Irefcell.

An input end of the precharge circuit 400 is connected with precharge voltage VDD, the output end of the precharge circuit 400 is connected with the data node, and the precharge circuit 400 is configured to charge the data node E to precharge voltage when a precharge signal Precharge-enb is received. Alternatively, the precharge circuit 400 includes a fourth PMOS transistor P4, a source of the fourth PMOS transistor P4 is connected with precharge voltage VDD, a gate of the fourth PMOS transistor P4 is configured to receive the precharge signal Precharge-enb, and a drain of the fourth PMOS transistor P4 is the output end of the precharge circuit 400.

One input end of the comparison circuit 500 is connected with the data node E, the other input end is connected with reference voltage Vref, and the comparison circuit 500 is configured to compare the reference voltage Vref and the voltage of the data node E when a second enable signal SEN2 is received, and output data stored in the embedded flash memory cell according to a comparison result. Alternatively, the comparison circuit 500 includes a first comparator Comp1, a first buffer U1 and a second buffer U2, an inverted-phase input end of the first comparator Comp1 is connected with the data node E, a normal-phase input end of the first comparator Comp1 is connected with the reference voltage Vref, an output end of the first comparator Comp1 is sequentially connected with the first buffer U1 and the second buffer U2, and an output end of the second buffer U2 is an output end of the reading circuit.

An equivalent bit line capacitor Cb is connected between the data node and a ground wire.

During reading operation, the present embodiment may sequentially include the following stages:

1. Preparation state: the first switch control voltage Y1 is applied to the first control end of the transmission gate, the second switch control voltage Y2 is applied to the second control end of the transmission gate, and the second switch control voltage Y2 is positive two-thirds of the first switch control voltage Y1 to make the transmission gate on. Since the first control end is the gate of the first NMOS transistor N1 and the second control end is the gate of the first PMOS transistor P1, the first switch control voltage Y1 is at a high level. After the transmission gate is on, the data node E is connected with the bit line BL.

Since the high-level first switch control voltage Y1 and the low-level second switch control voltage Y2 are respectively applied to the first control end and the second control end of the transmission gate of the switch circuit 100 at the preparation stage, taking that the transmission gate includes a first NMOS transistor N1 and a first PMOS transistor P1 as an example, at the preparation stage, high-level first switch control voltage Y1 is connected with a gate of the first NMOS transistor N1, and low-level second switch control voltage Y2 is connected with a gate of the first PMOS transistor P1. Even when the first switch control voltage Y1 is low such that the first NMOS transistor N1 cannot be on at the preparation stage, the first PMOS transistor P1 can still be on through the second switch control voltage Y2 applied to the first PMOS transistor P1, which makes the data node E and the bit line BL be normally connected through the switch circuit 100 after the preparation stage.

2. Precharge stage: the precharge signal (Precharge-enb) is applied to the precharge circuit 400 to charge the data node E to the precharge voltage. Taking that the precharge unit includes a fourth PMOS transistor P4 as an example, the fourth PMOS transistor P4 is at a low level, the fourth PMOS transistor P4 is controlled to be on, the precharge power supply charges the data node E through the fourth PMOS transistor P4, and the voltage of the data node E increases continuously till it is stable. Since the voltage of the data node E connected with the bit line BL increases continuously till it is stable at the precharge stage, the voltage on the bit line BL changes consistently with the voltage of the data node E.

3. Reading stage: first reading voltage is applied to the intermediate electrode of the flash memory cell through the word line WL. Since second reading voltage is applied to the bit line BL, taking that the current clamp circuit 200 includes a second NMOS transistor N2 and a first inverter INV1, and the current mirror circuit 300 is configured to mirror-output 30% of the reference current source (Irefcell) as an example, the current flowing through the second NMOS transistor N2 is clamped equal to the current of the flash memory cell, the mirror current output by the current mirror circuit 300 is compared with the current of the flash memory cell, and the data node E is charged or discharged according to a comparison result; the enable signal is applied to the enable end of the comparison circuit 500 such that the comparison circuit 500 compares the reference voltage Vref with the voltage of the data node E, and the data stored in the embedded flash memory cell is output according to the comparison result.

When the data stored in the flash memory cell is 1, at the reading stage, since the movement of a large amount of electrons between the source and the drain of the flash memory cell will generate large current relative to the mirror current, the data node E is discharged, the voltage of the data node E decreases continuously till the transmission gate if off, the comparison circuit 500 determines that the voltage of the inverted-phase input end is less than that of the normal-phase input end, and a high level is output to achieve reading "1".

When the data stored in the flash memory cell is 0, at the reading stage, the drain and source channels of the flash memory cell are completely closed, and the current on the bit line BL is read as close to 0. Therefore, when the data stored in the flash memory cell is 0, the voltage of data node E remains unchanged, it is still the precharge voltage, the comparison circuit 500 determines that the voltage of the inverted-phase input end is greater than the voltage of the normal-phase input end, and a low level is output to achieve reading "0".

Referring to FIG. 1, based on the above embodiment, the present embodiment provides another data reading circuit of an embedded flash memory cell. The number of the transmission gates of the switch circuit 100 is two in the present embodiment, the two transmission gates are respectively a first transmission gate TG1 and a second transmission gate TG2, the two transmission gates have the same structure as the transmission gate in the above embodiment, each transmission gate includes a first NMOS transistor N1 and a first PMOS transistor P1, the source of the first NMOS transistor N1 is connected with the source of the first PMOS transistor P1 to form one transmission end of the transmission gate, the drain of the first NMOS transistor N1 is connected with the drain of the first PMOS transistor P1 to form the other transmission end of the transmission gate, the gate of the first NMOS transistor N1 is the first control end of the transmission gate, and the gate of the first PMOS transistor P1 is the second control end of the transmission gate; one transmission end of the first transmission gate TG1 is connected with the detection end of the current clamp circuit 200, the other transmission end of the first transmission gate TG1 is connected with one transmission end of the second transmission gate TG2, and the other transmission end of the second transmission gate TG2 is connected with the drain of the embedded flash memory cell through the bit line BL.

An equivalent bit line capacitor Cb is connected between the data node and a ground wire.

For the reading operation in the present embodiment, a reference may be made to the above embodiment, which will not be repetitively described here.

Figure 3:
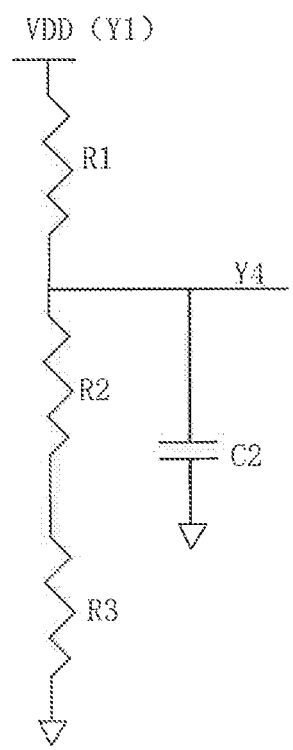
FIG. 3 illustrates a circuit diagram of a fourth switch control voltage generation module according to some embodiments.
Figure 5:
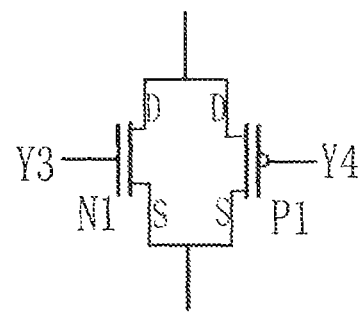
FIG. 5 illustrates a schematic diagram of a transmission gate in an off state according to some embodiments.

For the above embodiment, when the data reading circuit does not work, the switch circuit is open. Referring to FIG. 3 and FIG. 5, which respectively illustrate a circuit diagram of a fourth switch control voltage generation module provided by one exemplary embodiment of the application and a schematic diagram of a transmission gate in an off state provided by one exemplary embodiment of the application. Referring to FIG. 3 and FIG. 5, the transmission gate is off when the first control end receives third switch control voltage Y3 and the second control end receives fourth switch control voltage Y4, and a fourth switch control voltage Y4 generation module is configured to output the fourth switch control voltage Y4; alternatively, the fourth switch control voltage Y4 generation module includes a first resistor R1, one end of the first resistor R1 is connected with the first switch control voltage Y1, the other end of the first resistor R1 is connected with one end of a second resistor R2, the other end of the second resistor R2 is connected with one end of a third resistor R3, and the other end of the third resistor R3 is grounded; a connecting node between the first resistor R1 and the second resistor R2 is an output node of the fourth switch control voltage Y4 generation module, one end of a second capacitor C2 is connected with the output node of the fourth switch control voltage Y4 generation module, and the other end of the second capacitor C2 is grounded.

Taking that the transmission gate includes a first NMOS transistor N1 and a first PMOS transistor P1 as an example, a source of the first NMOS transistor N1 is connected with a source of the first PMOS transistor P1 to form one transmission end of the transmission gate, a drain of the first NMOS transistor N1 is connected with a drain of the first PMOS transistor P1 to form the other transmission end of the transmission gate, a gate of the first NMOS transistor N1 is the first control end of the transmission gate, and a gate of the first PMOS transistor P1 is the second control end of the transmission gate; the fourth switch control voltage Y4 is positive two-thirds of the first switch control voltage Y1; the third switch control voltage Y3 is at a low level and is 0V according to one embodiment; the fourth switch control voltage Y4 is at a high level and is ⅔VDD according to one embodiment.

Thus, when the third switch control voltage Y3 is input to the first control end, the first NMOS transistor N1 is off; when the fourth switch control voltage Y4 is input to the second control end, the first PMOS transistor P1 is off and the transmission gate is off.

Apparently, the above embodiments are only examples for clear description, instead of limitation to the embodiments. On the basis of the above description, those skilled in the art may make other different types of changes or variations. It is not necessary and impossible to enumerate all the embodiments here. The apparent changes or variations thus derived are still within the scope of protection of the application.

What is claimed is:

1. A data reading circuit of an embedded flash memory cell, comprises:
    a switch circuit, the switch circuit comprising a transmission gate, one transmission end of the transmission gate being connected with a drain of the embedded flash memory cell through a bit line, the other end of the transmission gate being connected with a detection end of a current clamp circuit, and the transmission gate being on when a first control end receives a first switch control voltage and/or a second control end receives a second switch control voltage;
    the current clamp circuit, a response end of the current clamp circuit being connected with a data node;
    a current mirror circuit, the current mirror circuit being connected with a reference current source of the data reading circuit of the embedded flash memory cell and the data node, and configured to mirror-output the reference current source;
    a precharge circuit, an output end of the precharge circuit being connected with the data node, and the precharge circuit being configured to charge the data node to precharge voltage when a precharge signal is received; and
    a comparison circuit, one input end of the comparison circuit being connected with the data node, the other input end being connected with reference voltage, the comparison circuit being configured to compare the reference voltage and the voltage of the data node when a second enable signal is received, and output data stored in the embedded flash memory cell according to a comparison result;
    wherein the first switch control voltage is at a high level and the second switch control voltage is at a low level,
    wherein the data reading circuit of the embedded flash memory cell further comprises a second switch control voltage generation module and the second switch control voltage generation module is configured to output the second switch control voltage;
    the second switch control voltage generation module comprises a fourth resistor, one end of the fourth resistor is connected with the first switch control voltage, the other end of the fourth resistor is connected with one end of a fifth resistor, the other end of the fifth resistor is connected with one end of a sixth resistor, the other end of the sixth resistor is connected with one end of a seventh resistor, the other end of the seventh resistor is connected with one end of a first capacitor, and the first capacitor is grounded;
    a connecting node between the sixth resistor and the seventh resistor is connected with one input end of a second comparator, the other input end of the second comparator is connected with a ground end, an output end of the second comparator is connected with an input end of a second inverter, an output end of the second inverter is connected with an enable end of a negative charge pump, an output end of the negative charge pump is connected with the other end of the seventh resistor, and a connecting node between the seventh resistor and the first capacitor is an output node of the second switch control voltage generation module;
    wherein the comparison circuit comprises a first comparator, a first buffer and a second buffer, an inverted-phase input end of the first comparator is connected with the data node, a normal-phase input end of the first comparator is connected with the reference voltage, an output end of the first comparator is sequentially connected with the first buffer and the second buffer, and an output end of the second buffer is an output end of the reading circuit.

2. The data reading circuit of the embedded flash memory cell according to claim 1, wherein the transmission gate comprises a first NMOS transistor and a first PMOS transistor, a source of the first NMOS transistor is connected with a source of the first PMOS transistor to form one transmission end of the transmission gate, a drain of the first NMOS transistor is connected with a drain of the first PMOS transistor to form the other transmission end of the transmission gate, a gate of the first NMOS transistor is the first control end of the transmission gate, and a gate of the first PMOS transistor is the second control end of the transmission gate.

3. The data reading circuit of the embedded flash memory cell according to claim 1, wherein an equivalent bit line capacitor is connected between the data node and a ground wire.

4. The data reading circuit of the embedded flash memory cell according to claim 1, wherein the current clamp circuit comprises a second NMOS transistor and a first inverter, an input end of the first inverter and a source of the second NMOS transistor form a detection end of the current clamp circuit, an output end of the first inverter is connected with a gate of the second NMOS transistor, and a drain of the second NMOS transistor is the response end of the current clamp circuit.

5. The data reading circuit of the embedded flash memory cell according to claim 1, wherein the current mirror circuit comprises a second PMOS transistor and a third PMOS transistor, a gate of the second PMOS transistor is connected with a gate of the third PMOS transistor, a source of the second PMOS transistor and a source of the third PMOS transistor are connected with power supply voltage, a drain of the second PMOS transistor is short-circuited with the gate of the second PMOS transistor, the drain of the second PMOS transistor is connected with one end of the reference current source, a drain of the third PMOS transistor is an output end of the current mirror circuit, and the output end of the current mirror circuit is connected with the data node.

6. The data reading circuit of the embedded flash memory cell according to claim 1, wherein the precharge circuit comprises a fourth PMOS transistor, a source of the fourth PMOS transistor is connected with precharge voltage, a gate of the fourth PMOS transistor is configured to receive the precharge signal, and a drain of the fourth PMOS transistor is the output end of the precharge circuit.

* * * * *